(12) United States Patent
Xia et al.

(10) Patent No.: US 8,963,223 B2
(45) Date of Patent: Feb. 24, 2015

(54) SCALABLE INTEGRATED MIM CAPACITOR USING GATE METAL

(75) Inventors: Wei Xia, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 776 days.

(21) Appl. No.: 12/660,619

(22) Filed: Mar. 1, 2010

(65) Prior Publication Data
US 2011/0210384 A1  Sep. 1, 2011

(51) Int. Cl.
| H01L 29/94 | (2006.01) |
| H01L 27/108 | (2006.01) |
| H01L 21/8242 | (2006.01) |
| H01L 21/336 | (2006.01) |
| H01L 49/02 | (2006.01) |
| H01L 23/522 | (2006.01) |
| H01L 27/06 | (2006.01) |
| H01L 27/08 | (2006.01) |

(52) U.S. Cl.
CPC ............ *H01L 28/60* (2013.01); *H01L 23/5223* (2013.01); *H01L 27/0629* (2013.01); *H01L 27/0805* (2013.01); *H01L 27/0811* (2013.01)
USPC .......................................... 257/296; 438/253

(58) Field of Classification Search
USPC ............................. 257/296, E27.016; 438/253
See application file for complete search history.

(56) References Cited

U.S. PATENT DOCUMENTS

| 2001/0010387 | A1* | 8/2001 | Yoo et al. ....................... 257/549 |
| 2004/0075174 | A1* | 4/2004 | Tamaru et al. ................. 257/758 |
| 2005/0001267 | A1* | 1/2005 | Miyagawa et al. ............ 257/332 |
| 2005/0179110 | A1* | 8/2005 | Koubuchi et al. ............. 257/506 |
| 2005/0194637 | A1* | 9/2005 | Tamaru ........................... 257/333 |
| 2006/0017087 | A1* | 1/2006 | Tamaru et al. ................. 257/301 |
| 2006/0017115 | A1* | 1/2006 | Tu et al. ......................... 257/371 |
| 2006/0180861 | A1* | 8/2006 | Tsujiuchi et al. ............. 257/347 |
| 2006/0189072 | A1* | 8/2006 | Tu ................................... 438/253 |
| 2007/0152241 | A1* | 7/2007 | Ahn ................................ 257/202 |
| 2007/0267752 | A1* | 11/2007 | Park ................................ 257/758 |
| 2008/0173978 | A1* | 7/2008 | Tu ................................... 257/532 |
| 2009/0090951 | A1* | 4/2009 | Chang et al. ................... 257/306 |
| 2010/0163949 | A1* | 7/2010 | Divakaruni et al. ........... 257/302 |
| 2011/0031585 | A1* | 2/2011 | Xia et al. ........................ 257/532 |

\* cited by examiner

*Primary Examiner* — Matthew Landau
*Assistant Examiner* — Igwe U Anya
(74) *Attorney, Agent, or Firm* — Oblon, Spivak, McClelland, Maier & Neustadt, L.L.P.

(57) ABSTRACT

According to one embodiment, a scalable integrated MIM capacitor in a semiconductor die includes a high-k dielectric segment over a substrate and a metal segment over the high-k dielectric segment, where the metal segment forms a capacitor terminal of the integrated MIM capacitor. The capacitor further includes a filler laterally separating consecutive capacitor terminals, where the filler can be used as a capacitor dielectric of the integrated MIM capacitor. In one embodiment, the metal segment comprises a gate metal. In another embodiment, the integrated MIM capacitor is formed substantially concurrently with one or more transistors without requiring additional fabrication process steps.

18 Claims, 5 Drawing Sheets

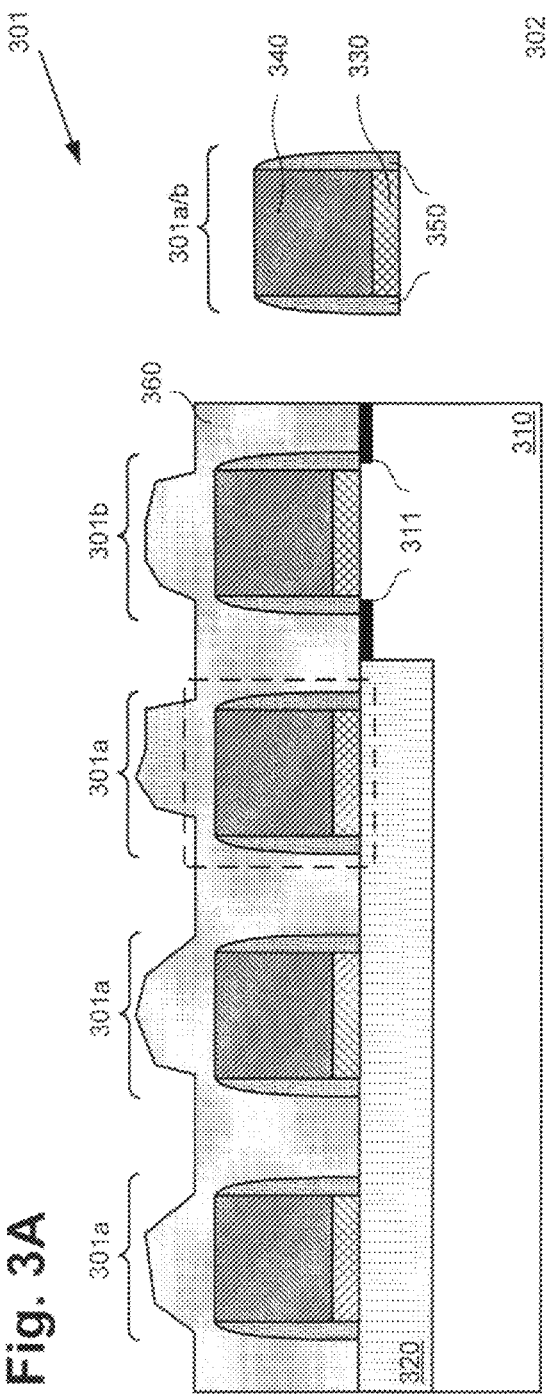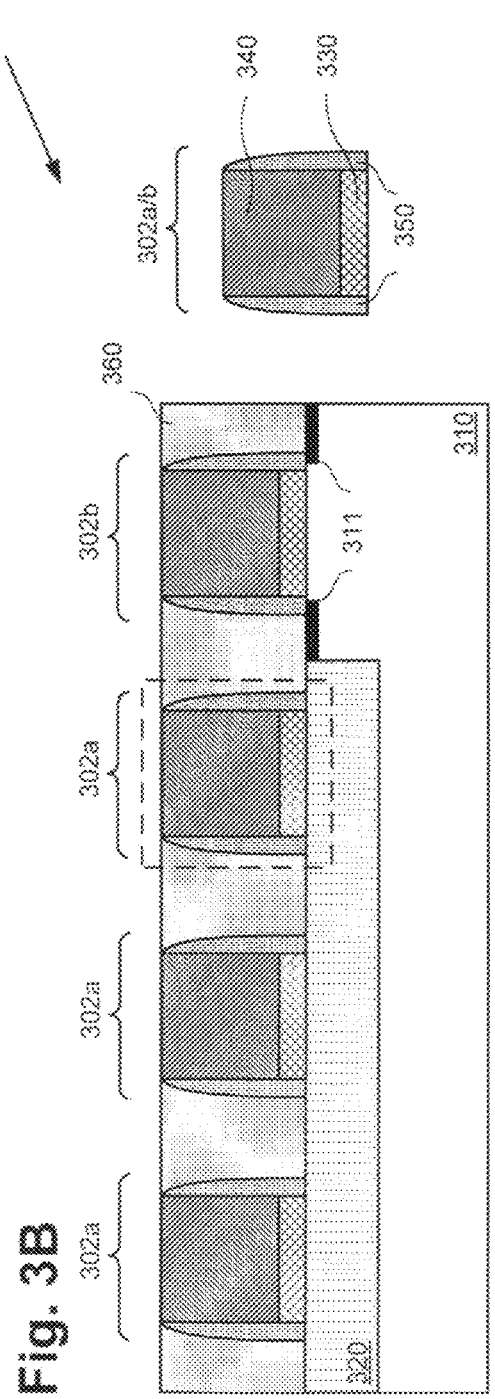

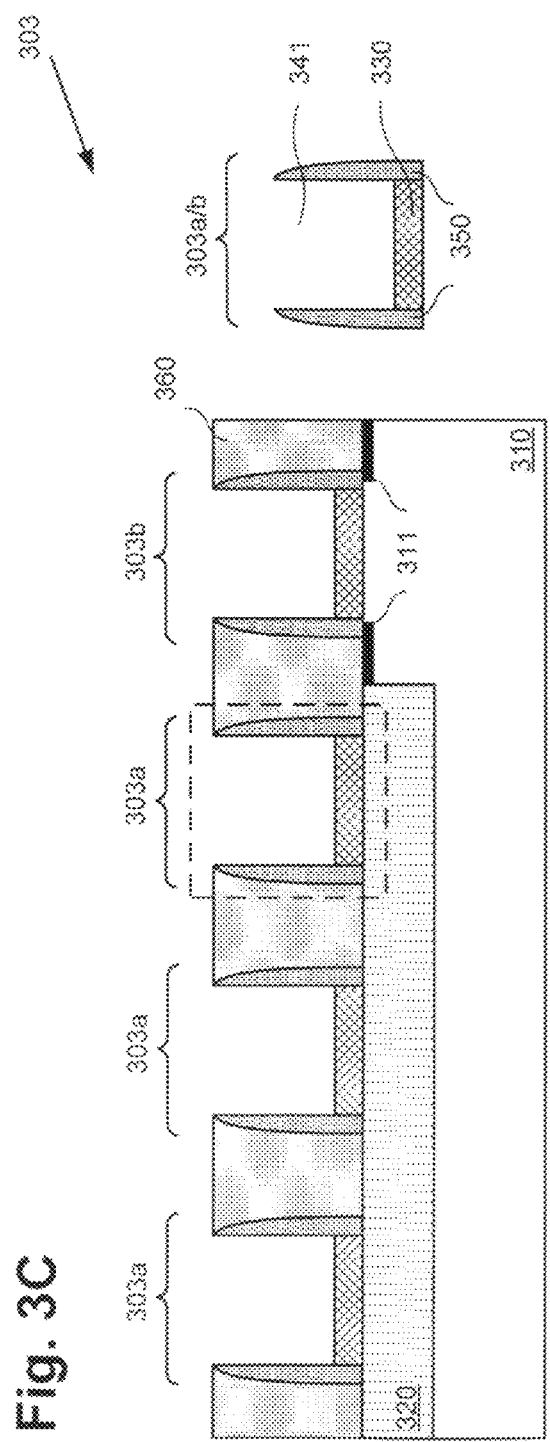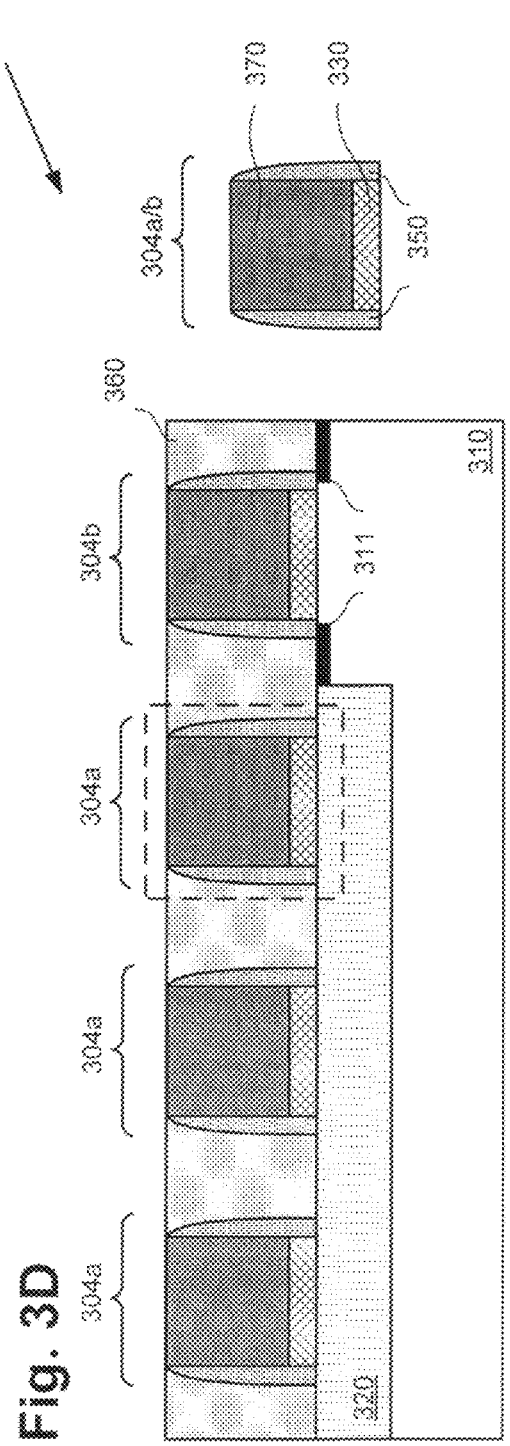
Fig. 3C
Fig. 3D

US 8,963,223 B2

SCALABLE INTEGRATED MIM CAPACITOR USING GATE METAL

BACKGROUND OF THE INVENTION

1. Field of the Invention

The present invention is generally in the field of semiconductors. More particularly, the present invention is in the field of capacitor fabrication in semiconductor dies.

2. Background Art

Integrated capacitors comprise a fundamental building block of integrated analog and mixed signal circuits fabricated on semiconductor dies. Metal-insulator-metal (MIM) type capacitors are particularly desired in the field because, for example, they exhibit a substantially linear response to an applied voltage and because they are relatively insensitive to temperature fluctuations. Conventional integrated MIM capacitors are typically fabricated during back end of the line (BEOL) processing because, historically, metal has not been a conventional constituent of other semiconductor device processing steps.

A conventional MIM capacitor can be fabricated, for example, by forming a dielectric layer for a MIM capacitor dielectric between metal layers for lower and upper MIM capacitor electrodes in the otherwise unused "vertical" space available over a semiconductor die during BEOL processing. However, forming the dielectric and metal layers during BEOL processing can require multiple process steps and masks, which can undesirably increase manufacturing cost.

In addition, BEOL processing significantly lags state-of-the-art size reduction techniques, and so as other design processes scale down, BEOL processing increasingly fails to produce detailed device structures as small as desired or as precisely as desired. As a result, BEOL fabricated MIM capacitors have relatively poor reliability, accuracy and density statistics.

Thus, there is a need to overcome the drawbacks and deficiencies in the art by providing an integrated capacitor that leverages high resolution processing techniques while minimizing the number of additional required processing steps.

SUMMARY OF THE INVENTION

A scalable integrated MIM capacitor using gate metal, substantially as shown in and/or described in connection with at least one of the figures, as set forth more completely in the claims.

BRIEF DESCRIPTION OF THE DRAWINGS

FIG. 3A illustrates a cross-sectional view, which includes a portion of a wafer processed according to an embodiment of the invention, corresponding to an initial step in the flowchart in FIG. 2.

FIG. 3B illustrates a cross-sectional view, which includes a portion of a wafer processed according to an embodiment of the invention, corresponding to an intermediate step in the flowchart in FIG. 2.

FIG. 3C illustrates a cross-sectional view, which includes a portion of a wafer processed according to an embodiment of the invention, corresponding to an intermediate step in the flowchart in FIG. 2.

FIG. 3D illustrates a cross-sectional view, which includes a portion of a wafer processed according to an embodiment of the invention, corresponding to a final step in the flowchart in FIG. 2.

DETAILED DESCRIPTION OF THE INVENTION

Figure 1A:
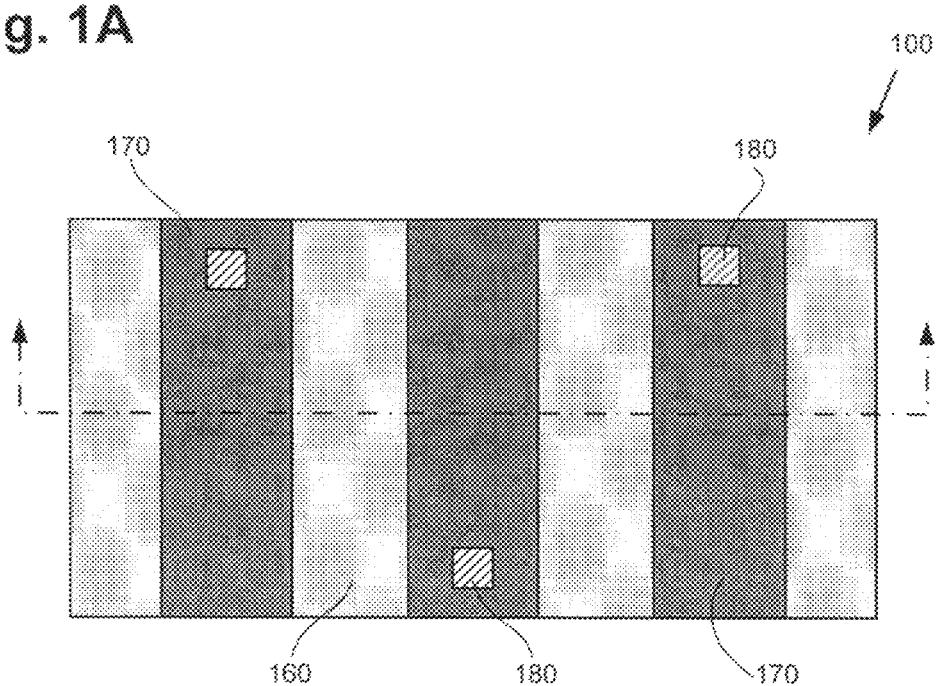
FIG. 1A illustrates a top-down view of a portion of a wafer processed according to an embodiment of the invention.

The present invention is directed to a scalable integrated MIM capacitor using gate metal. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

MIM capacitors inherently require metal in their construction. Conventional fabrication techniques typically have not included a metal processing step during a high precision front end of the line (FEOL) series of processing steps, so fabrication of integrated MIM capacitors has typically been relegated to the relatively low precision back end of the line (BEOL) series of processing steps. Such conventionally fabricated MIM capacitors may be relatively large and may have relatively thick segments of capacitor dielectric situated between their metal terminals. Thus, conventional integrated MIM capacitors typically use a large amount of die area for the amount of capacitance they exhibit, add time and cost to device fabrication, are relatively unreliable and inaccurate, and do not scale with advances in FEOL resolution enhancements.

Figure 1B:
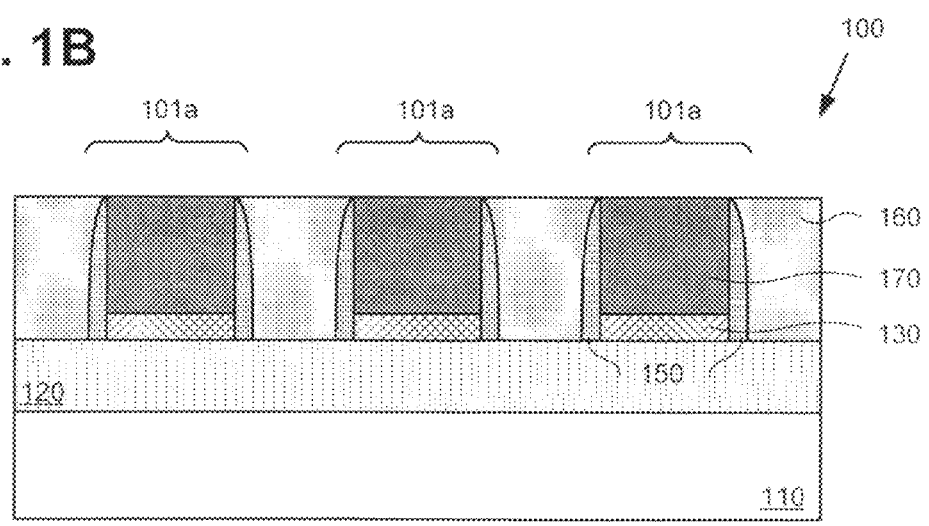
FIG. 1B illustrates a cross-sectional view of the portion of the wafer shown in FIG. 1A, processed according to an embodiment of the invention.

FIG. 1A and FIG. 1B illustrate respective top-down and cross-sectional views of an embodiment of the present invention that addresses the above problems. FIGS. 1A and 1B show MIM capacitor structure 100 formed by leveraging FEOL processing techniques originally developed to fabricate high dielectric constant (high-k) metal gate transistors (e.g., P type or N type field effect transistors—PFETs or NFETs) and other CMOS devices.

MIM capacitor structure 100 can comprise a series of gate metal terminals laterally separated from each other by a filler, wherein each element of MIM capacitor structure 100 can be formed during a high-k metal gate device fabrication process. As shown in FIG. 1B, MIM capacitor structure 100 comprises substrate 110, isolation region 120, multiple capacitor terminal stacks 101a, and etch-stop filler 160. Individual capacitor terminal stacks 101a can comprise high-k dielectric segment 130, gate metal terminal 170, and spacers 150. Composition and formation details of the above elements are more fully described with respect to FIGS. 2 and 3A through 3D below.

Substrate 110 can be configured to support isolation region 120 as well as other semiconductor devices as is shown in FIGS. 3A through 3D. Isolation region 120 can be configured to electrically isolate capacitor terminal stacks 101a from substrate 110.

Within each individual capacitor terminal stack 101a, high-k dielectric segment 130 can be configured to serve, among other things, to further electrically isolate gate metal terminal 170. Also within each individual capacitor terminal stack 101a, gate metal terminal 170 can be configured to serve, among other things, as a capacitor terminal within each capacitor terminal stack 100a. Spacers 150 and etch-stop filler 160 can be configured to form a capacitor dielectric, thereby, for example, completing MIM capacitor structure 100.

Individual capacitor terminal stacks 101a can be configured to act as positive or negative capacitor terminals by, for example, using conventional techniques to form contacts 180. Contacts 180 may comprise, for example, tungsten, formed over an end of each capacitor terminal stack 101a corresponding to either a positive or negative lead, thereby facilitating later integration into analog and mixed signal semiconductor circuits. One example of such a configuration can result in a comb-like capacitive structure as is shown in the top-down view of FIG. 1A. The capacitance of a completed integrated capacitor such as MIM capacitor structure 100 can roughly depend on the height, width, length, spacing and profile of gate metal terminals 170, spacers 150 and etch-stop filler 160, as well as which of gate metal terminals 170 in a particular MIM capacitor structure, such as MIM capacitor structure 100, are configured as positive or negative.

The height, width, length, spacing and profile of gate metal terminals 170, spacers 150 and etch-stop filler 160 can all be controlled by high precision FEOL processing techniques, which means that MIM capacitor structure 100 can scale with available FEOL processing technology. As a result, MIM capacitor structure 100 can be configured to exhibit a smaller overall size as well as a thinner dielectric segment than conventional MIM capacitors fabricated during BEOL processing. Accordingly, MIM capacitor structure 100 can exhibit a relatively large capacitance for the amount of die area it uses because its terminals can be formed relatively closely to one another, can exhibit better reliability and accuracy statistics due to the relatively greater precision and consistency of FEOL processing techniques, and can reduce overall time and cost of device fabrication by utilizing a process that can form high-k metal gate PFETs and other CMOS devices substantially concurrently with MIM capacitor structure 100.

Figure 2:
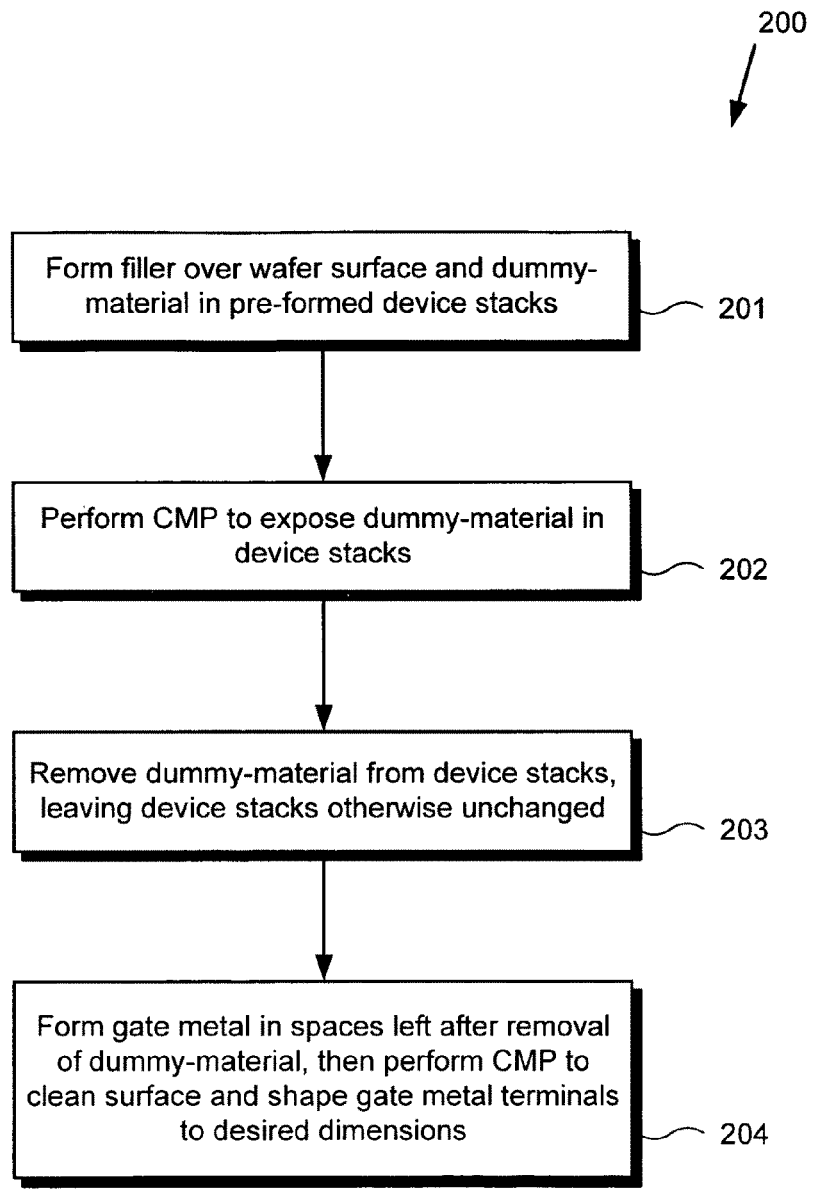
FIG. 2 shows a flowchart illustrating steps taken to implement an embodiment of the present invention.

FIG. 2 shows a flow chart illustrating a method for fabricating an integrated capacitor in a semiconductor die, according to an embodiment of the present invention. Certain details and features have been left out of flowchart 200 that are apparent to a person of ordinary skill in the art. For example, a step may consist of one or more substeps or may involve specialized equipment or materials, as known in the art. Steps 201 through 204 indicated in flowchart 200 are sufficient to describe one embodiment of the present invention; however, other embodiments of the invention may make use of steps different from those shown in flowchart 200.

Moreover, FIGS. 3A through 3D illustrate the result of performing steps 201 through 204 of flowchart 200, respectively. For example, FIG. 3A shows a semiconductor structure after processing step 201, FIG. 3B shows the structure in FIG. 3A after processing step 202, FIG. 3C shows the structure in FIG. 3B after processing step 203, and so forth.

It is noted that the processing steps shown in flowchart 200 are performed on a portion of a processed wafer, which, prior to step 201, may include, among other things, a substrate, such as a silicon substrate, isolation regions, such as STI regions, and partially formed high-k metal gate transistor gate stacks, such as pre-form PFET gate stacks, all formed in the substrate using conventional techniques. The wafer is also referred to simply as a wafer or a semiconductor die or simply a die in the present application. It is also noted that substrate 310, isolation region 320, high-k dielectric 330, gate metal terminal 370, spacers 350 and etch-stop filler 360 in FIGS. 3A through 3D correspond respectively to substrate 110, isolation region 120, high-k dielectric 130, gate metal terminal 170, spacers 150 and etch-stop filler 160 discussed with respect to FIGS. 1A and 1B above, e.g., each corresponding feature can comprise the same material as its counterpart, and each can be formed utilizing the same methods used to form its counterpart.

Referring now to step 201 of the method embodied in FIG. 2, step 201 of flowchart 200 comprises forming a filler layer over, for example, a series of partially formed high-k metal gate transistor stacks. FIG. 3A shows a structure including substrate 310, isolation region 320, pre-form capacitor terminal stacks 301a and pre-form PFET gate stack 301b after completion of step 201 of flowchart 200 in FIG. 2, where etch-stop filler 360 can be formed over pre-form capacitor terminal stacks 301a and pre-form PFET gate stack 301b.

As depicted in FIG. 3A, substrate 310 can comprise, for example, silicon, and can be configured to support formation of isolation region 320, pre-form PFET gate stack 301b, and gate/source regions 311, or other semiconductor structures or multiple embodiments of any of the above. Isolation region 320 can be a shallow trench isolation (STI) region comprised of silicon oxide or other dielectric material, for example, and can be configured to electrically isolate semiconductor structures (e.g., pre-form capacitor terminal stacks 301a) from substrate 310.

Pre-form capacitor terminal stacks 301a and pre-form PFET gate stack 301b can each comprise, for example, high-k dielectric segment 330, spacers 350, and dummy-material segment 340. As shown in FIG. 3A, pre-form capacitor terminal stacks 301a can be formed, for example, over isolation region 320 in substrate 310. Also as shown in FIG. 3A, pre-form PFET gate stack 301b can be formed over source/drain areas 311 in substrate 300, where source/drain areas 311 comprise, for example, portions of substrate 310 doped appropriately to match design requirements for PFET gate stack 301b, as known in the art.

While both pre-form capacitor terminal stacks 301a and pre-form PFET gate stack 301b can comprise the same high-k dielectric segment 330, dummy-material segment 340 and spacers 350 in cross-section, as shown in FIG. 3A, it should be noted that a patterned length (the unseen 3rd dimension) of each individual stack is not necessarily consistent across all stacks. For example, pre-form PFET gate stack 301b can be configured to exhibit a length substantially the same as its width, resulting in a square-like profile as seen from the top of the wafer, while each pre-form capacitor terminal stack 301a can, for example, be configured, as with each capacitor terminal stack 101a in FIG. 1, to have a length that is longer than its width, resulting in, for example, a comb-like shape similar to the top-down view of MIM capacitor structure 100 in FIG. 1A. A length of a pre-form capacitor terminal stack can be configured to produce, for example, a correspondingly larger or smaller metal-dielectric interface area (once a gate metal terminal is formed within each stack), and therein a larger or smaller capacitance for a completed integrated MIM capacitor, without significantly changing the FEOL processing steps used to produce, for example, a PFET gate stack. This distinction applies for each device stack described with respect to FIGS. 3B through 3D.

Within each device stack, high-k dielectric segment 330 can be, for example, an approximately 1.5 to 3.0 nm thick segment of a layer of high-k gate dielectric (e.g. a high-k dielectric suitable for forming a PFET gate dielectric) comprising, for example, a metal oxide such as hafnium oxide ($HfO_2$), zirconium oxide ($ZrO_2$), or the like, and can be formed in layer form by, for example, employing a physical vapor deposition (PVD) process, a chemical vapor deposition (CVD) process, or other deposition process as known in the art. Such layer can then be patterned, along with any layers formed over or under it, into, for example, high-k dielectric segment 330 using, for example, a conventional mask and etch process as known in the art. High-k dielectric segment 330 can be configured to serve, concurrently, both as an insulator for a capacitor terminal and as a gate dielectric for a high-k metal gate PFET, or it can be configured to serve similarly for multiple embodiments of each.

Dummy-material segment 340 can be, for example, a segment of a layer of polysilicon, or some other material suitable for later removal without significantly altering a then-existing height, width, length, spacing or profile of high-k dielectric segment 330, spacers 350, or etch-stop filler 360. Such layer can be configured to exhibit a vertical thickness equal to or greater than the desired height of, for example, either a capacitor terminal or a PFET metal gate, and can be formed over a layer of high-k dielectric (e.g., a high-k dielectric used to form high-k dielectric segment 330) by, for example, employing a low pressure chemical vapor deposition (LPCVD) process or other suitable deposition process as known in the art. Such layer can then be patterned, along with any layers formed under or over it, into, for example, dummy-material segment 340 using, for example, a conventional mask and etch process as known in the art. Dummy-material segment 340 can be configured to serve as a removable placeholder for gate metal terminal 370 as described further below with respect to FIGS. 3B through 3D.

Spacers 350 can comprise silicon oxide or other dielectric material as known in the art, and can be formed, for example, by conformally depositing a layer of dielectric material, such as silicon oxide, over high-k dielectric segment 330 and dummy-material segment 340, or multiple embodiments thereof, by employing a CVD process or other deposition process and then appropriately etching the layer of dielectric material in an etch-back process as known in the art. As shown in FIG. 3A, spacers 350 can be formed around high-k dielectric segment 330 and dummy-material segment 340 to form, for example, semiconductor device stacks such as pre-form capacitor terminal stacks 301a and pre-form PFET gate stack 301b, or multiple embodiments of each.

Etch-stop filler 360 can comprise a nitride material or other dielectric material suitable for discouraging removal of material other than dummy-material segment 340 during a dummy-material replacement process as is described more fully below, and can be formed, for example, by conformally depositing a layer of material, such as a nitride material, over pre-form capacitor terminal stacks 301a and pre-form PFET gate stack 301b by employing a CVD process or other deposition process as known in the art.

Spacers 350 and etch-stop filler 360 can be configured to form a capacitor dielectric for a MIM capacitor structure, as explained above with spacers 150 and etch-stop filler 160 with respect to MIM capacitor structure 100 in FIG. 1. Spacers 350 and etch-stop filler 360 can also be configured, concurrently, to protect substrate 310 (including source/drain regions 311) and isolation region 320 during, for example, a dummy-material replacement process used to remove dummy-material segment 340 from each pre-form capacitor terminal stack 301a and pre-form PFET gate stack 301b, as described below.

Continuing with step 202 in FIG. 2 and referring to FIG. 3B, step 202 of flowchart 200 comprises performing a chemical-mechanical planarization (CMP) step to accurately and concurrently shape dummy-material segment 340 in each pre-form capacitor terminal stack 302a and pre-form PFET gate stack 302b in preparation of replacing dummy-material segment 340 with gate metal. FIG. 3B shows the structure in FIG. 3A after completion of step 202 of flowchart 200 in FIG. 2, where each dummy-material segment 340, each spacer 350, and etch-stop filler 360 can be concurrently planarized using a CMP process as known in the art. Such CMP step can be used, for example, to remove portions of etch-stop filler 360, dummy-material segment 340, and spacers 350 to expose a surface of dummy-material segment 340 sufficient to enable, for example, removing dummy-material segment 340 without significantly altering the height, width, length, spacing or profile of high-k dielectric segment 330, spacers 350, or etch-stop filler 360.

FIG. 3C shows the structure in FIG. 3B after completion of step 203 of flowchart 200 in FIG. 2, which comprises removing each dummy-material segment 340 from pre-form capacitor terminal stacks 302a and pre-form PFET gate stack 302b, which can result in empty spaces 341 in pre-form capacitor terminal stacks 303a and pre-form PFET gate stack 303b. Removal of dummy-material segment 340 of FIG. 3B can be accomplished by a removal process tailored to dummy-material segment 340 and etch-stop filler 360, as well as to spacers 350 and high-k dielectric segment 330, comprising, for example, a conventional etch process as known in the art, and can result in removal of dummy-material segment 340 without significantly altering the height, width, length, spacing or profile of high-k dielectric segment 330, spacers 350, or etch-stop filler 360, leaving empty spaces 341 as shown in FIG. 3C.

Moving now to step 204 of FIG. 2 and referring to FIG. 3D, step 204 of flowchart 200 comprises forming gate metal terminals 370 in empty spaces 341 of FIG. 3C by depositing gate metal over the structure of FIG. 3C (thereby completing a dummy-material replacement process) and then cleaning and shaping the resulting surface with a final CMP step. FIG. 3D shows the structure in FIG. 3C after completion of step 204 of flowchart 200 in FIG. 2, where empty spaces 341 of FIG. 3C can be filled with, for example, gate metal, and the overall structure surface planarized to form, for example, gate metal terminals 370, which can result in capacitor terminal stacks 304a and PFET gate stack 304b. Capacitor terminal stacks 304a can be configured to form a MIM capacitor structure similar to MIM capacitor structure 100 in FIGS. 1A and 1B (using, for example, tungsten metal contacts such as contacts 180 shown in FIG. 1A), and PFET gate stack 304b can be configured to form a gate for a PFET transistor.

Within each capacitor terminal stack 304a and PFET gate stack 304b, gate metal terminal 370 can be, for example, an approximately 5 to 10 nm thick segment of gate metal comprising, for example, molybdenum (Mo), ruthenium (Ru), tantalum carbide nitride (TaCN), or other gate metal suitable for utilization in a PFET gate, and can be formed over high-k dielectric segment 330 by, for example, employing a PVD process, a CVD process, or other deposition process as known in the art, which can then be followed by, for example, a CMP step to clean any residual gate metal from the surface of etch-stop filler 360 or spacers 150 and to shape gate metal terminal 370, etch-stop layer 360, and spacers 350 according to a common desired height for capacitor terminal stacks 304a and PFET gate stack 304b. Gate metal terminal 370 can be configured to serve as a capacitor terminal within capacitor terminal stacks 304a, and, concurrently, a metal gate within PFET gate stack 304b, or configured to serve similarly within multiple embodiments for each.

While the embodiment in FIG. 3D can use three capacitor terminal stacks 304a to form a comb-like MIM capacitor structure similar to that depicted in FIG. 1A, other embodiments of the present invention can comprise only two capacitor terminal stacks (comprising, for example, one positive terminal and one negative terminal), or can comprise many multiple capacitor terminal stacks, or many multiple MIM capacitor structures connected in series or parallel, where each design is limited only by available wafer size and available fabrication techniques.

It is noted that in the embodiment shown in FIGS. 3A through 3D, capacitor terminal stack 304a may be characterized as a PFET gate stack 304b such that gate metal terminal 370 of capacitor terminal stack 304a (i.e. the capacitor terminal of capacitor terminal stack 304a) can comprise the same gate metal as the metal gate in PFET gate stack 304b. However, in another embodiment, the process for forming capacitor terminal stack 304a can be suitably modified to correspond to an NFET gate stack process (not explicitly shown by the present figures). Thus, in that latter embodiment, the capacitor terminal of capacitor terminal stack 304a can comprise the same gate metal as a metal gate in an NFET gate stack (also not explicitly shown by the present figures).

Figure 4A:
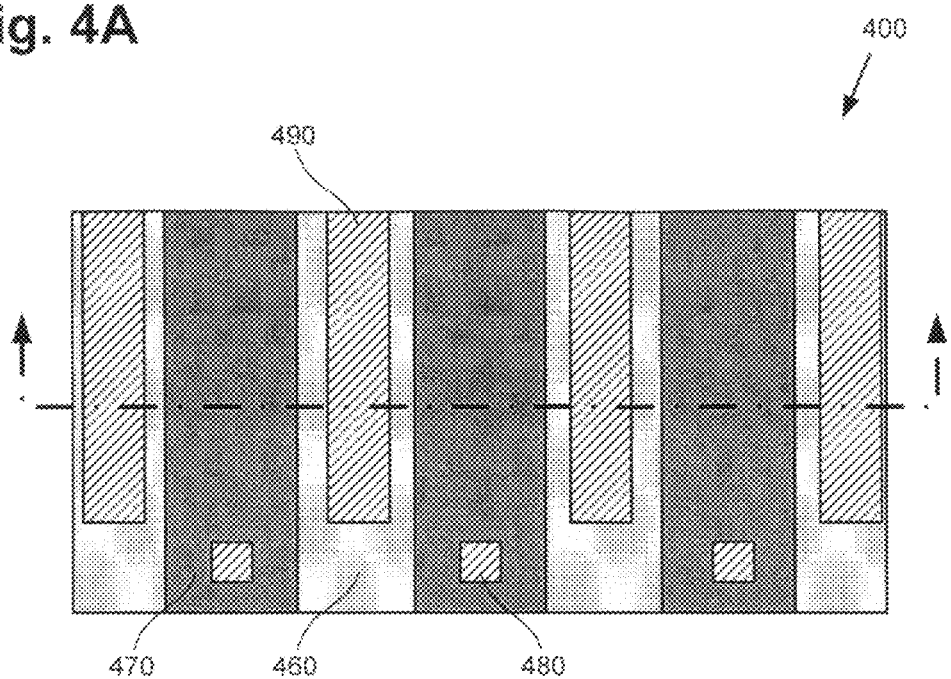
FIG. 4A illustrates a top-down view of a portion of a wafer processed according to an embodiment of the invention.
Figure 4B:
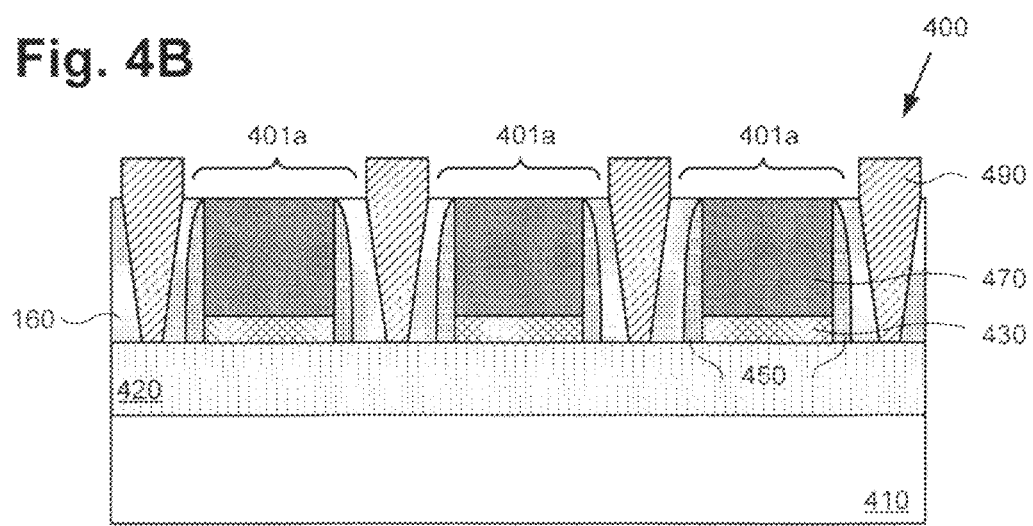
FIG. 4B illustrates a cross-sectional view of the portion of the wafer shown in FIG. 4A, processed according to an embodiment of the invention.

Another embodiment of the present invention is shown in FIGS. 4A and 4B. FIGS. 4A and 4B illustrate a high density MIM capacitor structure 400 similar to MIM capacitor structure 100 in FIGS. 1A and 1B, but where metal contact bars 490, formed in etch-stop filler 460, are configured to significantly increase a metal-dielectric interface area of high density MIM capacitor structure 400 with respect to MIM capacitor structure 100, thereby significantly increasing the capacitance of high density MIM capacitor structure 400 without significantly increasing die area usage.

In addition to metal contact bars 490, MIM capacitor structure 400 includes substrate 410, isolation region 420, etch-stop filler 460 and multiple capacitor terminal stacks 401a comprising high-k dielectric segment 430, gate metal terminals 470 and spacers 450, corresponding respectively to substrate 310, isolation region 320, etch-stop filler 360 and multiple capacitor terminal stacks comprising high-k dielectric 330, gate metal terminal 370 and spacers 350, in FIG. 3D. Each feature can comprise the same material as its counterpart, and each can be formed utilizing the same methods used to form its counterpart, for example.

Metal contact bars 490 can comprise, for example, tungsten or some other metal used, for example, to form contacts 480, and can be formed by, for example, first employing a conventional mask and etch process as known in the art to form trenches in, for example, etch-stop filler 460, and then using a conventional contact formation process as known in the art to form contact bars 490 substantially concurrently with contacts 480. As explained above, metal contact bars 490 can be configured to significantly increase the available metal-dielectric interface area, and can also be configured to serve as a contact surface to facilitate later integration into analog and mixed signal semiconductor circuits such as integrated circuits (ICs) containing multiple NFETs, PFETs, integrated resistors, integrated inductors and integrated MIM capacitors formed according to the present inventive concepts.

Thus, by using a high-k gate dielectric material as an insulating material and a gate metal as a capacitor terminal, the process for forming an embodiment of the disclosed integrated MIM capacitor structure is compatible with multiple high-k metal gate processes for advanced process technologies, such as 45 nm and smaller process technologies. Consequently, by forming at least one integrated MIM capacitor in at least one region of a substrate while concurrently forming at least one PFET or NFET gate stack in another region of a substrate, an embodiment of the present invention can advantageously form an integrated MIM capacitor without requiring additional masks or process steps beyond those required to form the PFET or NFET gate stacks.

In addition, by utilizing FEOL process technology, such as the multiple high-k metal gate processes above, an embodiment of the present invention's integrated MIM capacitor can be fabricated more precisely than a conventional MIM capacitor, and can therefore exhibit a smaller overall size for a given desired capacitance because its metal terminals can be formed closer together than when using conventional BEOL techniques. Accordingly, the present invention can produce a more reliable and more accurate integrated MIM capacitor than a conventional integrated MIM capacitor fabricated using BEOL processing techniques.

As described above, embodiments of the present invention provide an integrated MIM capacitor that uses a gate dielectric material, such as a high-k gate dielectric material, as an insulating material and a gate metal for a metal terminal. As such, an integrated MIM capacitor according to the present inventive concepts can be advantageously formed substantially concurrently with formation of PFET or NFET gate stacks without requiring additional masks or process steps beyond those required to form PFET or NFET gate stacks. By requiring no additional processing steps, or, in the case of a high density version of the present invention, potentially requiring only a single additional mask and etch step, embodiments of the present invention provide an integrated MIM capacitor that can be fabricated at a significantly lower cost compared to a conventional MIM capacitor, as is described above. Additionally, because the present inventive concepts disclose an integrated MIM capacitor fabricated using FEOL processing technology, embodiments of the present invention provide a reliable, accurate, scalable integrated MIM capacitor that can increase flexibility in the design of semiconductor circuits which can lead, for example, to overall advantageous reductions in device size and complexity.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An integrated capacitor comprising:
a filler formed on a substrate of a semiconductor die;

first and second substantially coplanar gate metal terminals formed on said substrate;
at least one contact formed on at least one of said first and second substantially coplanar gate metal terminals;
said first and second substantially coplanar gate metal terminals extending in a longitudinal direction and laterally separated from one another by said filler;
said filler including at least one metal contact bar formed between said first and second substantially coplanar gate material terminals;
said at least one metal contact bar extending in the longitudinal direction for a length that is less than a length of the first or second substantially coplanar gate metal terminals;
said filler, said first and second substantially coplanar gate metal terminals, and said at least one metal contact bar structured to produce a capacitance of said integrated capacitor,
wherein said at least one contact is formed at a position in the longitudinal direction on the at least one of said first and second substantially coplanar gate metal terminals that is beyond an end of said at least one metal contact bar in the longitudinal direction.

2. The integrated capacitor of claim 1, wherein at least one of said filler and said first and second substantially coplanar gate metal terminals is formed on an isolation region of said substrate.

3. The integrated capacitor of claim 1, wherein said filler comprises:
at least one spacer;
at least one etch-stop filler segment;
said at least one metal contact bar, said at least one etch-stop filler segment, said at least one spacer and at least one of said first and second substantially coplanar gate metal terminals structured to produce said capacitance of said integrated capacitor;
said at least one metal contact bar is formed in the at least one etch-stop filler segment;
said at least one spacer is formed between said at least one metal contact bar and one of said first and second substantially coplanar gate metal terminals.

4. The integrated capacitor of claim 1, further comprising:
a transistor gate stack formed concurrently with said integrated capacitor, at least one of said first and second substantially coplanar gate metal terminals comprising a metal structured to comprise a metal gate of said transistor gate stack.

5. The integrated capacitor of claim 1, wherein said first gate metal terminal comprises a first metal and said second gate metal terminal comprises a second metal.

6. The integrated capacitor of claim 1, wherein said at least one contact is formed at a position in a height direction that is below an upper contact surface of said at least one metal contact bar.

7. The integrated capacitor of claim 6, wherein said at least one contact is substantially coplanar in the height direction with an upper surface of said filler, and said at least one metal contact bar extends in the height direction beyond said upper surface of said filler.

8. A method for fabricating an integrated capacitor comprising:
forming a filler including an insulator on a substrate of a semiconductor die;
forming first and second substantially coplanar gate metal terminals on said substrate;
forming at least one contact on at least one of said first and second substantially coplanar gate metal terminals;
said first and second substantially coplanar gate metal terminals are formed to extend in a longitudinal direction and to be laterally separated from one another by said filler;
forming at least one metal contact bar in said filler between said first and second substantially coplanar gate material terminals;
said at least one metal contact bar extending in the longitudinal direction for a length that is less than a length of the first or second substantially coplanar gate metal terminals;
said forming said filler, said forming said first and second substantially coplanar gate metal terminals, and forming said at least one metal contact bar performed to produce a capacitance of said integrated capacitor,
wherein said at least one contact is formed at a position in the longitudinal direction on the at least one of said first and second substantially coplanar gate metal terminals that is beyond an end of said at least one metal contact bar in the longitudinal direction.

9. The method of claim 8, wherein said first and second substantially coplanar gate metal terminals are formed by a dummy-material replacement process, said dummy-material replacement process comprising:
forming first and second dummy-material segments on said substrate;
removing said first and second dummy-material segments from said substrate;
forming said first and second substantially coplanar gate metal terminals on said substrate substantially in the positions of said first and second dummy-material segments.

10. The method of claim 8, wherein at least one of said filler and said first and second substantially coplanar gate metal terminals is formed on an isolation region of said substrate.

11. The method of claim 8, wherein said forming said filler comprises forming, in said filler:
at least one spacer;
at least one etch-stop filler segment;
said at least one metal contact bar, said at least one etch-stop filler segment, said at least one spacer and at least one of said first and second substantially coplanar gate metal terminals formed to produce said capacitance for said integrated capacitor;
said at least one metal contact bar is formed in the at least one etch-stop filler segment;
said at least one spacer is formed between said at least one metal contact bar and one of said first and second substantially coplanar gate metal terminals.

12. The method of claim 8, further comprising:
forming a transistor gate stack substantially concurrently with said integrated capacitor, at least one of said first and second substantially coplanar gate metal terminals formed to include a metal structured to comprise a metal gate of said transistor gate stack.

13. The method of claim 8, wherein said first gate metal terminal comprises a first metal and said second gate metal terminal comprises a second metal.

14. An integrated circuit (IC) including at least one CMOS device and at least one integrated capacitor, said at least one integrated capacitor comprising:
a filler including an insulator and formed on a substrate of a semiconductor die;
first and second substantially coplanar gate metal terminals formed on said substrate;
at least one contact formed on at least one of said first and second substantially coplanar gate metal terminals;

said first and second substantially coplanar gate metal terminals extending in a longitudinal direction and laterally separated from one another by said filler;

said filler including at least one metal contact bar formed between said first and second substantially coplanar gate material terminals;

said at least one metal contact bar extending in the longitudinal direction for a length that is less than a length of the first or second substantially coplanar gate metal terminals;

said filler, said first and second substantially coplanar gate metal terminals, and said at least one metal contact bar structured to produce a capacitance of said integrated capacitor, wherein said at least one contact is formed at a position in the longitudinal direction on the at least one of said first and second substantially coplanar gate metal terminals that is beyond an end of said at least one metal contact bar in the longitudinal direction.

15. The IC of claim 14, wherein at least one of said filler and said first and second substantially coplanar gate metal terminals is formed on an isolation region of said substrate.

16. The IC of claim 14, wherein said filler comprises:
at least one spacer;
at least one etch-stop filler segment;
said at least one metal contact bar, said at least one etch-stop filler segment, said at least one spacer and at least one of said first and second substantially coplanar gate metal terminals structured to produce said capacitance for said integrated capacitor;
said at least one metal contact bar is formed in the at least one etch-stop filler segment;
said at least one spacer is formed between said at least one metal contact bar and one of said first and second substantially coplanar gate metal terminals.

17. The IC of claim 14, further comprising:
a transistor gate stack formed concurrently with said IC, at least one of said first and second substantially coplanar gate metal terminals comprising a metal structured to comprise a metal gate of said transistor gate stack.

18. The IC of claim 14, wherein said first gate metal terminal comprises a first metal and said second gate metal terminal comprises a second metal.

* * * * *